US009401275B2

United States Patent
Akasaki et al.

(10) Patent No.: US 9,401,275 B2
(45) Date of Patent: Jul. 26, 2016

(54) WORD LINE WITH MULTI-LAYER CAP STRUCTURE

(71) Applicant: SanDisk Technologies Inc., Plano, TX (US)

(72) Inventors: Keita Akasaki, Yokkaichi (JP); Hirotada Tobita, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/476,176

(22) Filed: Sep. 3, 2014

(65) Prior Publication Data

US 2016/0064276 A1 Mar. 3, 2016

(51) Int. Cl.
*H01L 21/3205* (2006.01)
*H01L 21/4763* (2006.01)
*H01L 21/033* (2006.01)
*H01L 21/768* (2006.01)
*H01L 27/115* (2006.01)
*H01L 21/308* (2006.01)

(52) U.S. Cl.
CPC ........ *H01L 21/0332* (2013.01); *H01L 21/0338* (2013.01); *H01L 21/3081* (2013.01); *H01L 21/3088* (2013.01); *H01L 21/76832* (2013.01); *H01L 21/76856* (2013.01); *H01L 21/76885* (2013.01); *H01L 27/115* (2013.01); *H01L 27/11517* (2013.01); *H01L 27/11524* (2013.01)

(58) Field of Classification Search
CPC ............ H01L 21/0332; H01L 21/0338; H01L 21/3081; H01L 21/3088; H01L 27/115; H01L 27/11517
See application file for complete search history.

(56) References Cited

U.S. PATENT DOCUMENTS

| | | |
|---|---|---|
| 5,570,315 A | 10/1996 | Tanaka et al. |
| 5,768,192 A | 6/1998 | Eitan |
| 5,774,397 A | 6/1998 | Endoh et al. |
| 6,011,725 A | 1/2000 | Eitan |
| 6,046,935 A | 4/2000 | Takeuchi et al. |
| 7,655,536 B2 | 2/2010 | Higashitani |
| 7,951,669 B2 | 5/2011 | Harari et al. |
| 7,960,266 B2 | 6/2011 | Kai et al. |
| 8,097,504 B2 | 1/2012 | Mokhlesi et al. |
| 2005/0157549 A1* | 7/2005 | Mokhlesi .............. H01L 27/115 365/185.01 |
| 2008/0157403 A1* | 7/2008 | Lee ................... H01L 21/32139 257/787 |
| 2009/0061622 A1* | 3/2009 | Ahn ..................... H01L 21/0332 438/656 |
| 2009/0080229 A1 | 3/2009 | Chandra Sekar et al. |
| 2011/0309425 A1 | 12/2011 | Purayath et al. |
| 2012/0187468 A1 | 7/2012 | Liang et al. |
| 2014/0097482 A1 | 4/2014 | Tokunaga et al. |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
Fazio, "Flash Memory Scaling," MRS Bulletin, Nov. 2004, pp. 814-817.
Kwon, "Delving Deep into Micron and Intel's 20-nm 64-Gbit MLC NAND Flash Memory," http://www.eetimes.com/General/PrintView/4369862, Mar. 26, 2012, 3 pages.

* cited by examiner

*Primary Examiner* — Jesse Y Miyoshi
(74) *Attorney, Agent, or Firm* — Davis Wright Tremaine LLP

(57) ABSTRACT

Word lines are formed from a stack of layers that includes a metal (e.g. tungsten) layer with an overlying multi-layer cap structure. The multi-layer cap structure includes a layer with a low etch rate to protect metal from damage during anisotropic etching. The multi-layer cap structure includes a layer with stress (e.g. tensile) that is opposite to the stress of the metal (e.g. compressive) to provide low combined stress.

10 Claims, 6 Drawing Sheets

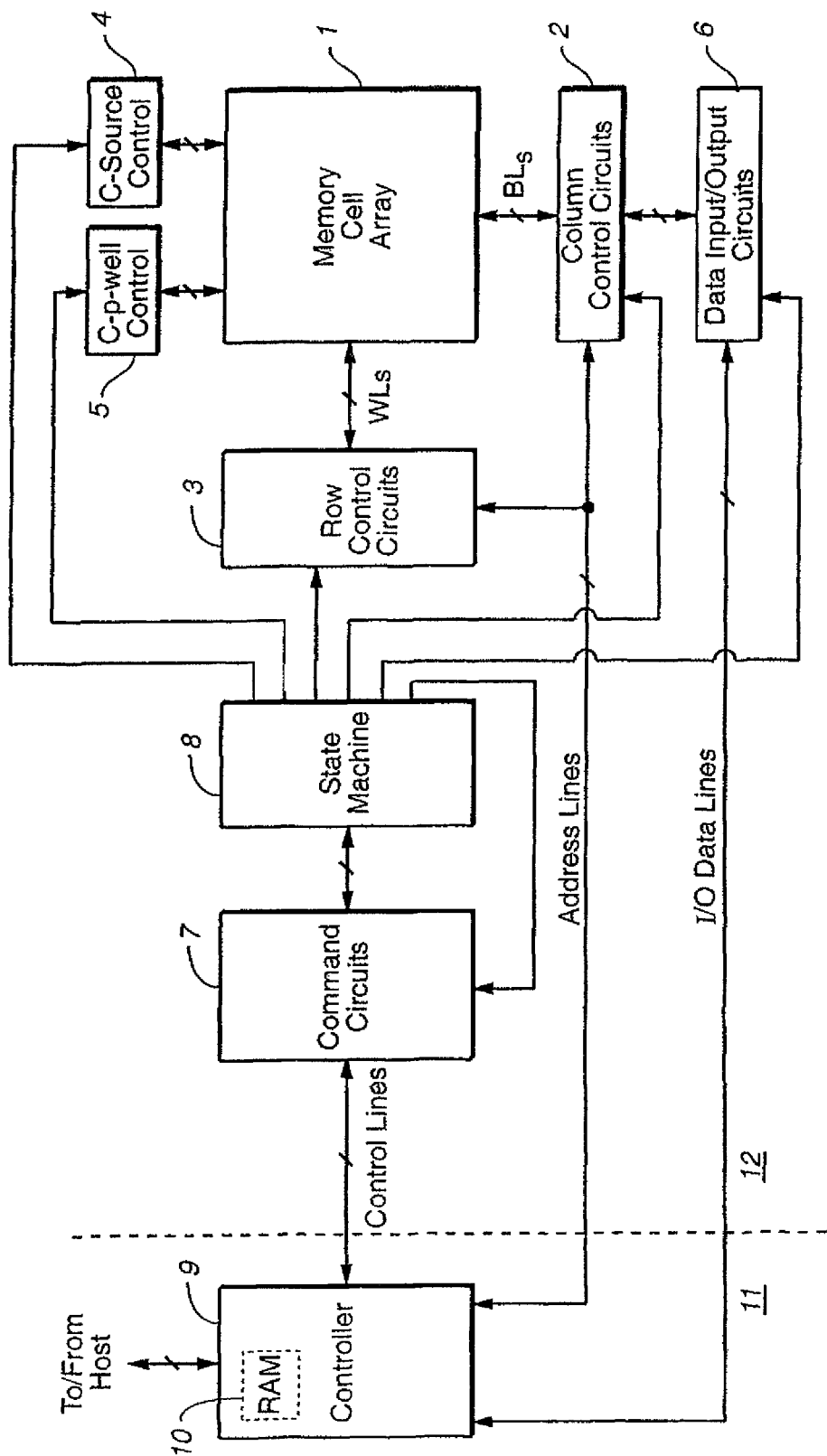
FIG._1
*(Prior Art)*

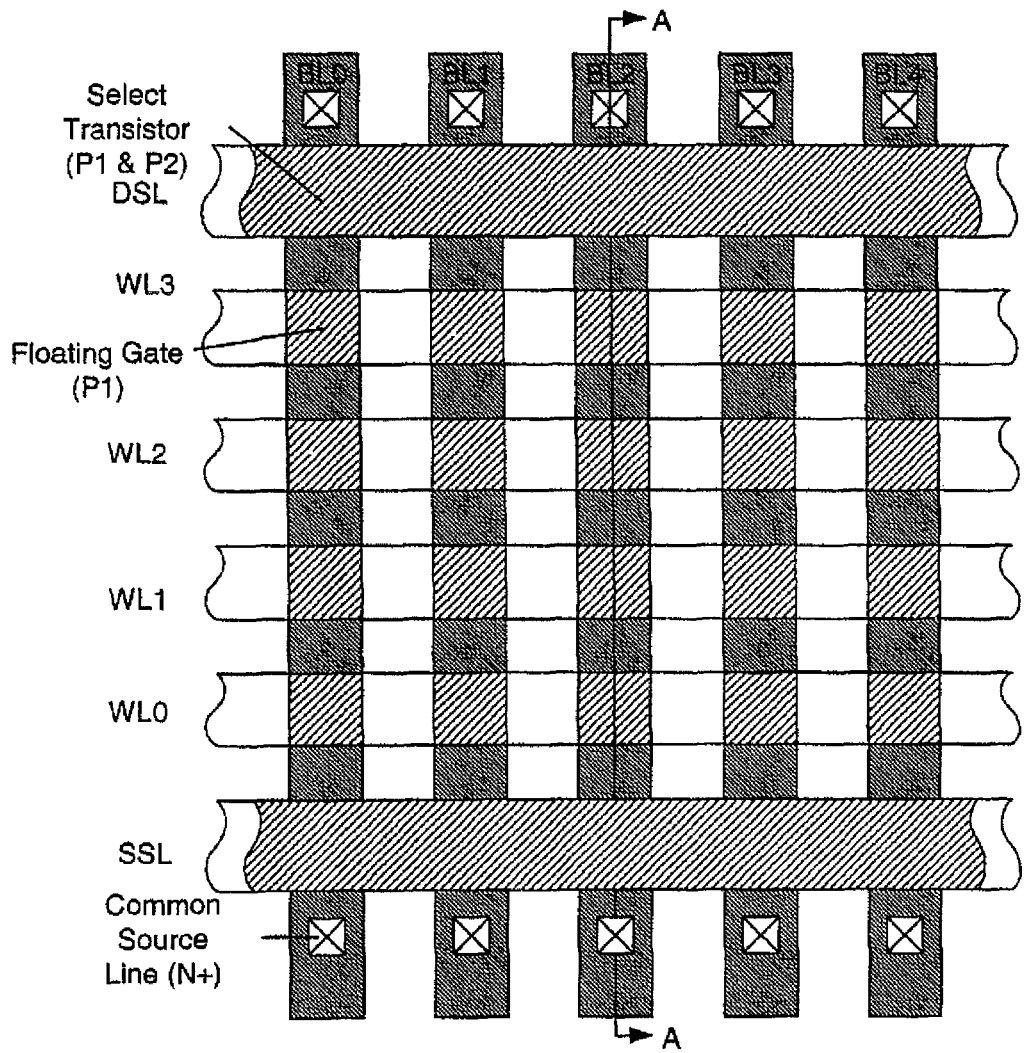
FIG._ 2A (PRIOR ART)

(Section A-A)

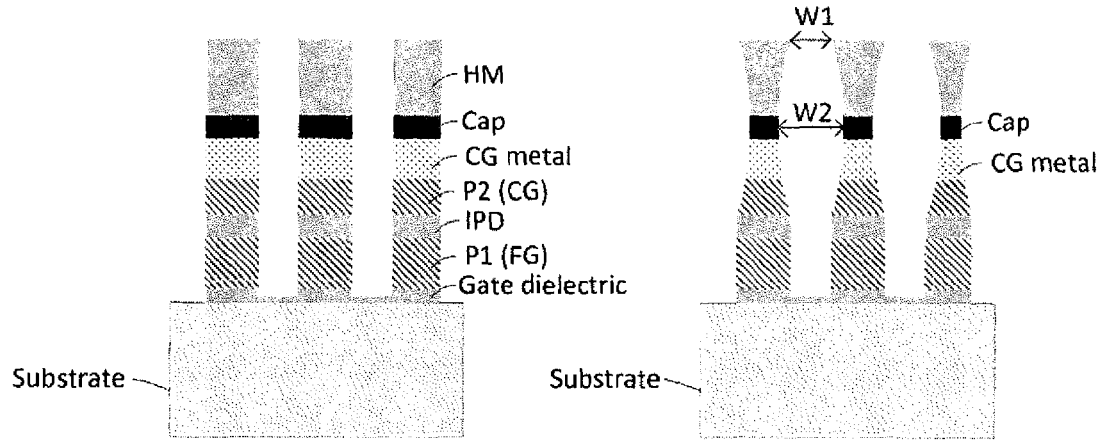
FIG. 3 (Prior Art)  FIG. 4 (Prior Art)
FIG. 5 (Prior Art)
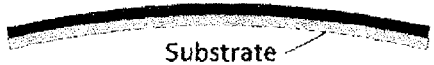
FIG. 6 (Prior Art)

WORD LINE WITH MULTI-LAYER CAP STRUCTURE

BACKGROUND

This application relates generally to the formation and structure of memory cell arrays and particularly to multi-layer stacks of materials used to form word lines in such memory arrays.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 2B, a cross-section along line A-A of FIG. 2A). A control gate metal (not shown) may overlie the poly 2 layer so that control gates are formed by a combination of doped polysilicon and metal (e.g. tungsten). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

The top and bottom of the string connect to the bit line and a common source line respectively through select transistors (source select transistor and drain select transistor) in which the floating gate material (P1) is in direct contact with the control gate material (P2) through an opening formed in IPD material.

SUMMARY

In some integrated circuits, word lines are formed from a stack of layers that includes a metal (e.g. tungsten) layer with an overlying cap. A multi-layer cap structure, comprising two or more layers of different materials with different properties, may be used as a cap. The multi-layer cap structure may include a layer with a low etch rate to protect metal from damage during anisotropic etching. The multi-layer cap structure may include a layer with a stress (e.g. tensile) that is opposite to the stress of the metal (e.g. compressive) to provide low combined stress. For example, for a metal layer formed of tungsten, an amorphous silicon layer may provide etch protection during etching while a silicon nitride layer may provide tensile stress that opposes (and may substantially negate) the compressive stress produced by the tungsten.

An example of an etched multi-layer stack includes: a first layer formed of a first material, the first layer having a first stress, and a first etch rate when etched to form strips; a second layer of a second material formed on the first layer, the second layer being thinner than the first layer, the second layer having a second stress, and having a second etch rate that is lower than the first etch rate when etched to form the strips; and a third layer of a third material formed on the second layer, the third layer being thinner than the first layer and having a third stress that is opposite of the first stress.

The forces generated by the first, second, and third stresses may be substantially balanced to provide an aggregated stress in the multi-layer stack that is below a predetermined limit. The strips may form word lines of a NAND flash memory array. The first and second stresses may be of the same kind, either compressive or tensile and the third stress may generate a force that is substantially equal in magnitude to opposing forces generated by combined first and second stresses. The first stress may be compressive stress, the second stress may be compressive stress, and the third stress may be tensile stress. The first material may be tungsten. The third material may be silicon nitride. The second material may be silicon oxide. The second layer may be formed using silane in a plasma Chemical Vapor Deposition (CVD) process. Etching to form the strips may use fluorine-containing gas and the second material is amorphous silicon.

An example of a method of forming a patterned multi-layer stack includes: depositing a first layer of a first material that is electrically conductive over a substrate, the first layer having a first stress; subsequently depositing a second layer of a second material on the first layer, the second layer being thinner than the first layer, the second layer having a second stress; subsequently depositing a third layer of a third material on the second layer, the third layer being thinner than the first layer, the third layer having a third stress that is opposite of the first stress; subsequently fanning a mask pattern over the third layer; and subsequently etching the third layer, the second layer, and the first layer with the mask pattern in place over the third layer, using anisotropic etching with a lower etching rate for the second material than the first material.

The forces generated by the first, second, and third stresses may be substantially balanced to provide an aggregated stress in the first, second, and third layers that is below a predetermined limit. The etching may pattern the first, second, and third layers to form word lines of a NAND flash memory array. The first and second stresses may be of the same kind, either compressive or tensile, and the third stress may generate a force that is substantially equal in magnitude to opposing forces generated by combined first and second stresses. The first stress may be compressive stress, the second stress may be compressive stress, and the third stress may be tensile stress. The first material may be tungsten. The third material may be silicon nitride. The second material may be silicon oxide. The second layer may be deposited using silane in a plasma Chemical Vapor Deposition (CVD) process. The etching may use fluorine-containing gas and the second material is amorphous silicon.

Additional aspects, advantages and features are included in the following description of examples, which description should be taken in conjunction with the accompanying drawings.

BRIEF DESCRIPTION OF THE DRAWINGS

FIG. 1 is a block diagram of a prior art memory system.

FIG. 2A is a plan view of a prior art NAND array.

FIG. 3 shows word lines of the prior art in cross section at an intermediate stage of fabrication.

FIG. 4 shows damage to word lines of the prior art.

FIG. 5 shows an example of a film with tensile stress.

FIG. 6 shows an example of a film with compressive stress.

DETAILED DESCRIPTION OF EXEMPLARY EMBODIMENTS

Memory System

Figure 2B:
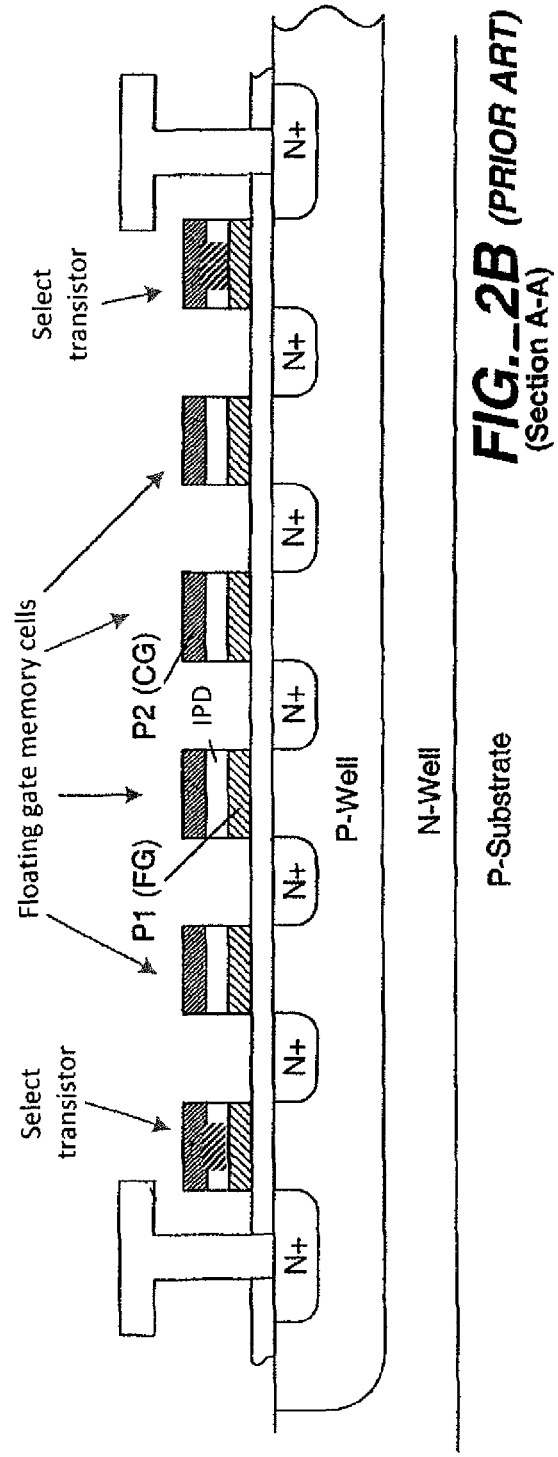
FIG. 2B is a cross-sectional view of the prior art NAND array of FIG. 2A taken along the line A-A.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Examples other than the two dimensional and three dimensional exemplary structures described here may be used as alternatives in some cases.

An example of a prior art memory system, which may be modified to include various aspects described here, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device.

In addition to the NAND strings that form the memory array, memory integrated circuits generally include various peripheral circuits that provide access to the memory array as described above. Transistors formed in such peripheral circuits have different requirements to the floating gate transistors of the memory array. However, it is generally desirable to form peripheral transistors and floating gate transistors of the memory array using the same process steps as much as possible.

FIG. 3 shows an idealized example of word lines of a memory array according to the prior art. A stack of physical layers are patterned into floating gates and overlying word lines. In particular, a gate dielectric layer (e.g. silicon oxide, "gate oxide," or "tunnel oxide") is formed on the surface of the substrate and a first doped polysilicon layer (floating gate poly, "FG poly" P1) is formed on the gate dielectric layer. An Inter Poly Dielectric (IPD) layer (e.g. silicon oxide) overlies the first doped polysilicon layer and a second doped polysilicon layer ("CG poly" P2) overlies the IPD layer. The IPD layer insulates the floating gates formed in the first doped polysilicon layer from the second doped polysilicon layer. A conductive metal layer ("CG metal") overlies the second doped polysilicon layer and is in electrical contact with second doped polysilicon layer so that word lines are formed as a two layer structure in this example. For example, the conductive metal layer may be formed of tungsten which provides lower resistance than doped polysilicon alone. A cap layer ("Cap") overlies the conductive metal layer and a hard mask layer ("HM") overlies the cap layer. It will be understood that the hard mask layer may be formed of a suitable material, e.g. silicon oxide formed using Tetraethyl orthosilicate (TEOS), and may be patterned using photoresist and photolithographic patterning. The hard mask layer provides a pattern when etching through the stack to form the structures of FIG. 3. Anisotropic etching such as Reactive Ion Etching (RIE) may be used to etch vertically so that the hard mask pattern is extended downwards through the stack of layers.

FIG. 4 shows how a cap layer with a relatively high etch rate may affect formation of word lines and floating gates in a stack structure. In this example, the cap layer has an etch rate that is significant. Ideally, the cap layer would have a very low etch rate, significantly lower than the etch rate of the underlying metal layer so that it protects the metal layer. In this case, the cap layer has an etch rate that is not significantly lower than the metal layer and thus does not provide ideal protection. While anisotropic etching is directed downwards, some etching may occur laterally. In particular, ions produced by RIE may not travel in a perfectly vertical direction (they may deviate somewhat from vertical) and some chemically active ions may interact with sides of openings as etching proceeds. How such ions interact with sidewalls of openings depends on the materials that are present. Where a cap layer has a relatively high etch rate as shown, a recess may develop at this point. Such a recess may not only affect the cap layer but may also affect layers above and below the cap layer as shown. As the cap layer erodes it exposes more of the layers above and below it. In particular, the layer below may be exposed to ions that are directed downwards by RIE. This increased exposure tends to cause increased erosion of the underlying layer which in this case is CG metal. Thus, sidewalls become concave as shown as the openings expand from their design dimension W1 to W2.

One consequence of such concave sidewalls is that the metal layer may become narrower than intended. The etched portions of metal layer are shown being reduced in width as openings expand. This narrowing of the metal portions of word lines reduces the cross section of word lines and thus increases resistance of word lines. Increased word line resistance increases delay in accessing memory cells and may cause a memory chip to be considered defective (i.e. a chip with word lines that are narrowed may fail to meet a specified standard for access time when tested). An example of a cap layer that may have a significant etch rate that leads to the situation of FIG. 4 is silicon nitride (SiN).

In addition to its effect on etching discussed above, a cap layer may have other significant effects. One effect of a cap layer may be to change the stress in a substrate such as a silicon wafer. As is well known, when a film is deposited on a substrate (either directly or on one or more intervening layers) the film may produce tensile stress as shown in FIG. 5 or compressive stress as shown in FIG. 6. High levels of either tensile or compressive stress are undesirable because they may cause damage such as delamination of layers in a stack. For example, high stress in a word line stack may cause a word line to collapse. Some metals used in IC fabrication may produce significant stress. For example, tungsten tends to produce compressive stress so that word lines formed of tungsten may suffer from word line collapse if adequate measures are not taken to counter such stress.

According to an example presented here, a cap layer is provided that is a composite layer formed of at least two layers of two different materials. One of the layers has a low etch rate so that it protects underlying metal during anisotropic etching. Another of the layers provides a stress that tends to negate the stress of the metal layer (i.e. if metal produces compressive stress this layer may be chosen to produce tensile stress, if metal produces tensile stress then this layer may be chosen to produce compressive stress).

Figure 7:
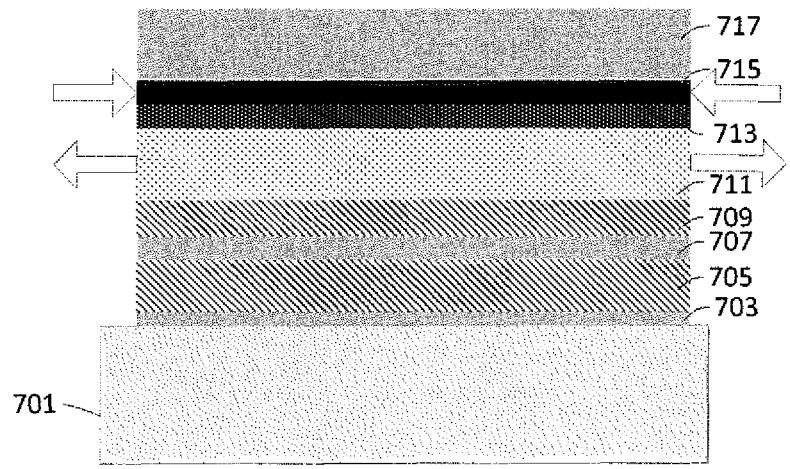
FIG. 7 shows an example of a multi-layer cap that includes an etch-resistant layer and a stress relief layer.

FIG. 7 shows a structure including a substrate 701, gate dielectric layer 703, floating gate polysilicon layer 705, IPD layer 707, control gate polysilicon layer 709, control gate metal layer 711, first cap layer 713, second cap layer 715, and a hard mask layer 717. Over the metal layer 711, first cap layer 713 is formed of a first material that provides significant protection from etching. In particular, the first material may be chosen so that it has a very low etch rate when etched during the etch step that divides the stack into separate word lines. The stress produced by the first cap layer may be either compressive or tensile and may or may not be significant.

Over first cap layer 713 is a second cap layer 715 formed of a second material that is different to the first material. The second cap layer provides a stress that opposes stress from the metal layer. Thus, by completely or at least partially negating the stress produced by the metal layer 711, second cap layer 715 reduces or eliminates the total stress produced by the stack of layers. A suitable thickness may be calculated for second cap layer 715 so that it substantially reduces or eliminates overall stress in the stack. For example, the stress produced by the second cap layer may be approximately equal in magnitude and opposite in direction (tensile or compressive) to the stress produced by the metal layer. If the stress produced by the first cap layer 713 (or other layer) is significant then this may be factored in also when calculating a suitable thickness for the second cap layer.

In an example, metal layer 711 is formed of tungsten, which produces compressive stress. For example, a tungsten layer with a thickness of about 35 nanometers may be used. The material chosen for first cap layer 713, and the thickness of first cap layer 713 may depend on the etch conditions used to separate word lines. For example, etching through the multi-layer stack may use a multi-step process RIE process with different etching conditions for each step. In one example, a gas containing CF4 is used to etch through the tungsten layer, followed by a gas containing C12 for etching through control gate polysilicon, then a gas containing CHF3 to etch through the IPD layer, and a gas containing HBr for etching through floating gate polysilicon. A suitable first material for first cap layer 713 may be amorphous silicon and a suitable thickness for first cap layer 713 to provide protection from etching may be about 5 nanometers. Amorphous silicon may be deposited using a suitable precursor gas such as silane (SiH4) in a Chemical Vapor Deposition (CVD) process. Amorphous silicon tends to produce compressive stress so that first cap layer 713 in this example adds to the stress produced by the tungsten layer.

A suitable second material for second cap layer 715 may be silicon nitride and a suitable thickness may be about 5 nanometers. Silicon nitride tends to produce tensile stress. A layer of silicon nitride that is 5 nanometers thick has been found to be sufficient to substantially negate the stress produced by a 35 nanometer tungsten layer and a 5 nanometer amorphous silicon layer. In general, it is not necessary to reduce total stress of the stack to zero, it is generally sufficient if the stress can be reduced below an upper limit that ensures that the risk of word line collapse is low. For example, for a given structure there may be a particular failure mode that occurs above a certain stress level (e.g. word line collapse in a particular NAND flash memory design may occur above a certain stress level). An upper limit for stress may be set accordingly so that the risk of such failure is low. It will be understood that this limit depends on the particular structure involved and on the nature of the failure mode. While a second cap layer formed of silicon nitride may suffer from significant erosion during etching, the underlying first cap layer of amorphous silicon protects the tungsten from erosion and tends to confine any narrowing of the etched stack structure to higher levels (above the tungsten layer).

Figure 8:
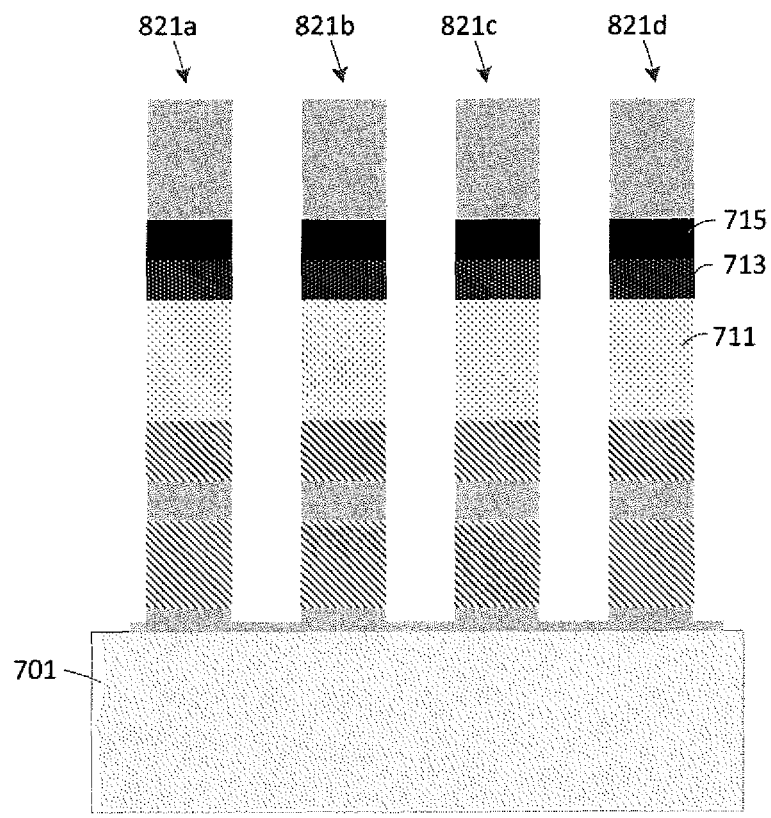
FIG. 8 illustrates etching using a multi-layer cap to maintain word line dimensions.

FIG. 8 shows the stack of FIG. 7 after etching to form separate word lines 821a-d. Etching may be performed using any suitable anisotropic etching scheme. First cap layer 713 provides protection for metal layer 711 and prevents erosion of metal layer 711 during etching. Second cap layer 715 provides stress relief by opposing stress produced by the metal layer 711 (and, in some cases, opposing stress produced by the first cap layer 713).

Figure 9:
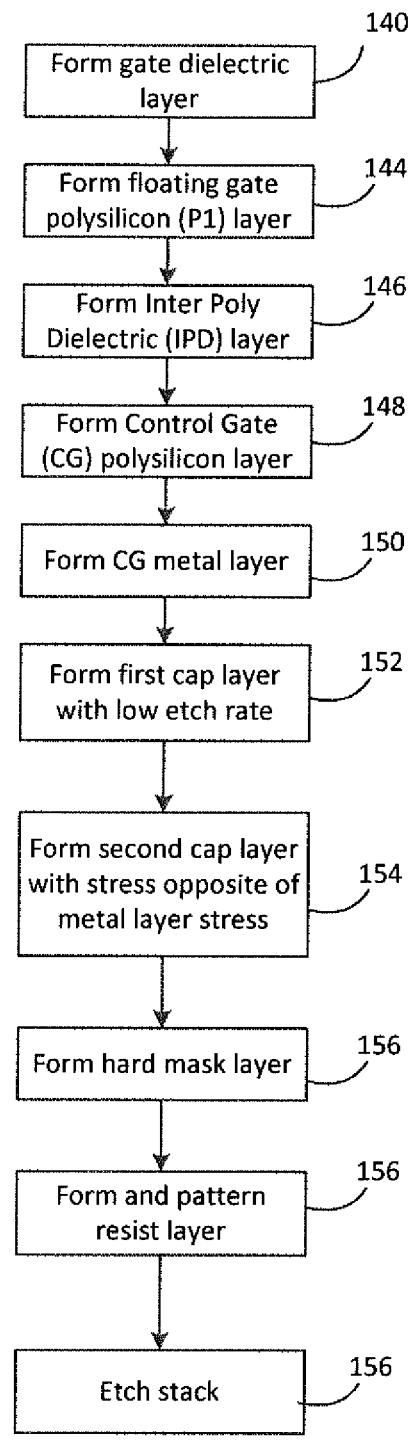
FIG. 9 illustrates an example of a series of steps used to form a word line stack.

FIG. 9 illustrates an example of steps that may be used in framing word lines in a nonvolatile memory array. A gate dielectric layer (e.g. silicon oxide) is formed over a substrate 140 (e.g. silicon wafer) and a layer of doped polysilicon (P1) is formed over the dielectric layer 144. A dielectric layer (Inter Poly Dielectric, or "IPD") is then formed 146 and a control gate (CG) polysilicon layer is formed over the IPD layer 148. A control gate metal layer is then formed 150 (e.g.

of tungsten). A first cap layer is formed of a first material (e.g. amorphous silicon) that has a low etch rate for the chosen etch conditions for separating word lines 152. A second cap layer is formed of a second material that produces a stress that is opposed to the stress produced by the meta layer 154 (i.e. if metal produces tensile stress then the second material produces compressive stress and if metal produces compressive stress then the second material produces tensile stress). A suitable thickness for the second cap layer may be chosen to balance the stress produced by the metal layer (i.e. to be about the same in magnitude and opposite in direction). The stress from the first cap layer may also be factored into this calculation if the first cap layer produces significant stress. A hard mask layer is then formed 156 (e.g. of amorphous silicon or silicon oxide). A resist layer is then formed (e.g. spun on) and patterned 156 using anisotropic etching (e.g. RIE). The stack is then etched into separate word lines 156. It will be understood that variations on this series of steps are possible including one or more additional layers.

CONCLUSION

Although the various aspects have been described with respect to exemplary embodiments, it will be understood that protection within the full scope of the appended claims is appropriate.

It is claimed:

1. A method of forming a patterned multi-layer stack, the method comprising:
depositing a first layer of a first material that is electrically conductive over a substrate, the first layer having a first stress;
subsequently depositing a second layer of a second material on the first layer, the second layer being thinner than the first layer, the second layer having a second stress;
subsequently depositing a third layer of a third material on the second layer, the third layer being thinner than the first layer, the third layer having a third stress that is opposite of the first stress, wherein the third stress generates a force that is substantially equal in magnitude to opposing forces generated by combined first and second stresses;
subsequently forming a mask pattern over the third layer; and
subsequently etching the third layer, the second layer, and the first layer with the mask pattern in place over the third layer, using anisotropic etching with a lower etching rate for the second material than the first material.

2. The method of claim 1 wherein forces generated by the first, second, and third stresses are substantially balanced to provide an aggregated stress in the first, second, and third layers that is below a predetermined limit that ensures a risk of collapse of word lines formed from the first, second, and third layers is low.

3. The method of claim 1 wherein the etching patterns the first, second, and third layers to form word lines of a NAND flash memory array.

4. The method of claim 1 wherein the first and second stresses are of the same kind, either compressive or tensile.

5. The method of claim 4 wherein the first stress is compressive stress, the second stress is compressive stress, and the third stress is tensile stress.

6. The method of claim 5 wherein the first material is tungsten.

7. The method of claim 6 wherein the third material is silicon nitride.

8. The method of claim 7 wherein the second material is silicon oxide.

9. The method of claim 8 wherein the second layer is deposited using silane in a plasma Chemical Vapor Deposition (CVD) process.

10. The method of claim 1 wherein the etching uses fluorine-containing gas and the second material is amorphous silicon.

* * * * *